United States Patent [19]

Kushibiki et al.

[11] Patent Number: 5,026,618

[45] Date of Patent: Jun. 25, 1991

[54] PHOTOSENSITIVE MATERIAL AND VOLUME TYPE PHASE HOLOGRAM MEMBER FORMED THEREFROM

[75] Inventors: Nobuo Kushibiki, Yamato; Yoko Yoshinaga, Machida; Tetsuro Kuwayama, Yokohama; Naosato Taniguchi, Atsugi, all of Japan

[73] Assignee: Canon Kabushiki Kaisha, Tokyo, Japan

[21] Appl. No.: 310,616

[22] Filed: Feb. 15, 1989

[30] Foreign Application Priority Data

Feb. 16, 1988 [JP] Japan .................................. 63-31957

[51] Int. Cl.[5] ........................ G03C 1/73; G03C 1/795
[52] U.S. Cl. ........................................ 430/2; 430/1; 430/271
[58] Field of Search ................................ 430/271, 2, 1

[56] References Cited

U.S. PATENT DOCUMENTS

| | | | |
|---|---|---|---|
| 4,172,724 | 10/1979 | Matsumoto et al. | 96/27 H |
| 4,201,441 | 5/1980 | Matsumoto et al. | 350/3.61 |
| 4,258,111 | 3/1981 | Matsumoto et al. | 430/2 |
| 4,287,277 | 9/1981 | Matsumoto et al. | 430/2 |

FOREIGN PATENT DOCUMENTS

| | | |
|---|---|---|
| 57-128378 | 8/1982 | Japan . |
| 59-119376 | 7/1984 | Japan . |
| A853587 | 11/1960 | United Kingdom . |
| A1273329 | 9/1968 | United Kingdom . |

*Primary Examiner*—Cynthia Hamilton
*Attorney, Agent, or Firm*—Fitzpatrick, Cella, Harper & Scinto

[57] ABSTRACT

A photosensitive material is provided which comprises (i) a substrate comprising a crosslinked polymer having a transmittance of 90% or more in a wavelength region of from 400 to 700 nm and a refractive index of 1.55 or more, and (ii) a sensitive material layer provided on the substrate and mainly composed of a vinylcarbazole polymer. A hologram member employing the photosensitive material is also provided.

8 Claims, No Drawings

PHOTOSENSITIVE MATERIAL AND VOLUME TYPE PHASE HOLOGRAM MEMBER FORMED THEREFROM

BACKGROUND OF THE INVENTION

1. Field of the Invention

The present invention relates to a novel photosensitive material, and a volume type phase hologram member formed by use of the same.

2. Related Background Art

Holography is a technique for recording an optical image by irradiating an object with a coherent light such as a laser beam; projecting onto a sensitive layer the light reflected by or transmitted through the object and modulated in terms of amplitude and phase corresponding to the shape of the object to be recorded; and illuminating the resulting hologram to reproduce the recorded optical image of the object. Thus, for example, a three-dimensional optical image can be viewed on a flat sheet film.

With development of researches on such holography, at present time it has been made considerably clear what are required for the sensitive materials therefor. Known as the sensitive materials usable in holography are various materials including silver halide emulsions, photoresists, thermoplastics, dichromated gelatin, inorganic glass materials and ferroelectric crystals, and researches are further being made on the suitability of the materials to the holography.

In recording a reflection hologram, in particular, as a volume phase type hologram, substrates are employed for holding and fixing sensitive materials in consideration of the required positional fixing of the sensitive material as the indispensable factor for light exposure because of the lattice distance of as minute as 0.1–0.3 μm and need for fixing the sensitive material layer in the subsequent development by solvent treatment. Thus, glass substrates have been used in holograms formed of a sensitive material composed of gelatin, polyvinyl carbazole or the like, because one of the two light beams used for the exposure to light in forming the hologram is required to be transmissive through the substrate.

In particular, because of a strong hygroscopicity of the gelatin in instances in which a hologram recording layer comprises gelatin, the glass substrates have been considered to have the best performance to protect the recording layer from the surrounding moisture.

On the other hand, in instances in which the recording layer comprises a material being highly inert to water, care need not be taken as in the case of the gelatin.

In addition, employment of the glass substrates cannot obviate the problems of insufficient strength against stress such as impact, a danger when broken, in addition to the large weight.

From these viewpoints, it has been attempted to use substrates other than glass when the sensitive material comprises polyvinyl carbazole.

For example, U.S. Pat. No. 4,172,724 discloses that polyester is used as a substrate, and Japanese Patent Laid-open Publication No. 57-128378 (1982) discloses that methyl methacrylate resins, styrene resins, polyester resins and diethylene glycol allyl carbonate resins are used as substrates. Japanese Patent Laid-open Publication No. 59-119376 (1984) also discloses that CR-39 [a trade name of diethylene glycol bis(allyl carbonate)] is used as a substrate.

Of these polymers, the crystalline polymer polyester resins have a superior solvent resistance as compared with non-crystalline polymers, but may be affected by crystal orientation when exposed to light, since the substrates are formed by processing such as biaxial elongation. Since the crystals thus oriented may cause laser beams to be polarized and may further cause the beams to be scattered by the degree of chain orientation, such resins are not suited to the preparation of high-performance holograms.

The styrene resins and methyl methacrylate resins, which are amorphous and non-crosslinked polymers, are not necessarily uniform in their structure, and hence the non-uniformity of density causes the laser beams to be scattered, bringing about hindrance of exposure to light, and have a low solvent resistance and impact strength, disadvantageously.

The diethylene glycol bis(allyl carbonate), though it is a non-crystalline crosslinked polymer, has a refractive index as low as 1.5, so that a hologram formed by using it may result in spurious transmission or reflection hologram (undesired fringes) in the hologram.

For example, in display system using a reflection hologram, the spurious reflection hologram creates ghost images and the spurious transmission hologram creates rainbow-like flare patterns. Moreover the transmittance of the whole hologram may be decreased because of the angle dependence possessed by the spurious hologram. The performances of holograms may be similarly lowered also when the undesired reflection diffraction fringes are formed in transmission holograms.

SUMMARY OF THE INVENTION

Accordingly, an object of the present invention is to provide a novel photosensitive material for forming a hologram with decreased spurious hologram.

Another object of the present invention is to provide a filmy hologram member having high light-transmission properties, high diffraction efficiency, high strength, and high impact resistance, and being free of any spurious hologram.

The above objects can be achieved by the present invention described below.

The present invention provides a photosensitive material, comprising (i) a substrate comprising a crosslinked polymer having a transmittance of 90% or more in a wavelength region of from 400 to 700 nm and a refractive index of 1.55 or more, and (ii) a sensitive material layer provided on said substrate and mainly composed of a vinylcarbazole polymer.

The present invention also provides a hologram member, comprising (i) a substrate comprising a crosslinked polymer having a transmittance of 90% or more in a wavelength region of from 400 to 700 nm and a refractive index of 1.55 or more, (ii) and a hologram formed on a film mainly composed of a vinylcarbazole polymer.

DESCRIPTION OF THE PREFERRED EMBODIMENTS

The crosslinked polymer used in the present invention is required to have no absorption particularly in the photosensitive region possessed by a polyvinyl carbazole type of sensitive material, i.e., to have a transmittance of 90% or more in a wavelength region of from 400 to 700 nm. This is prerequisite since the substrate must transmit illumination light and diffraction light, irrespective of whether the hologram is of a transmission type or reflection type. The crosslinked polymer is also required to have a refractive index of not less than 1.55 or more, and more preferably not less than 1.6.

Thus the formation of unintended transmission type diffraction hologram (spurious hologram) is at most suppressed which arises from the interference between the light reflected at the interface and the light introduced thereto.

X is Cl or Br; Y is —, —O—, —CO—, —SO$_2$—, —CH$_2$—, —CH=CH— or

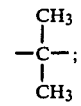

m and n are each an integer of 1 to 4; and a and b are each independently an integer of 0 to 4.

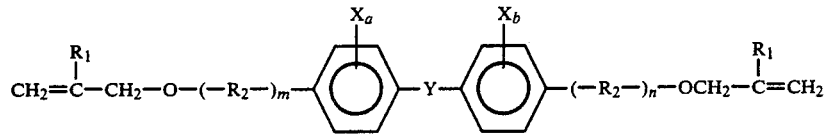

Fundamentally the crosslinked polymer may preferably have the same refractive index with that of polyvinyl alcohol. A refractive index which is different between them by 0.2 or 0.1 decreases the undesired transmission diffraction hologram (spurious hologram) to ½ or ¼, respectively.

wherein R$_1$, R$_2$, X, Y, m, n, a and b are as defined above.

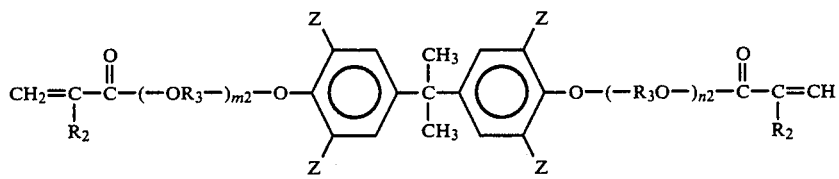

From the viewpoint of coherent light exposure, the substrate is desired to have birefringence and uniform refractive index (in other words, homogeneity in density) to be not more than $1 \times 10^{-3}$ and not more than $1 \times 10^{-2}$, and more preferably not more than $5 \times 10^{-3}$ and not more than $1 \times 10^{-3}$, respectively.

The birefringence can be measured by use of a precision strain indicator, and the uniformity in refractive index, by use of a Machazender interferometer.

The crosslinked polymer used in the present invention may preferably be a polymer comprising a polyfunctional monomer having an aromatic ring. The polyfunctional monomer means herein a monomer having two or more carbon-carbon double bonds. Examples of such a monomer include a bis(oxyalkylenephenyl)diallyl carbonate represented by the following Formula (I) and derivatives thereof, a bis-(oxyalkylenephenyl)diallyl ether represented by the following Formula (II) and derivatives thereof, and a diacrylate or dimethacrylate having aromatic rings, represented by the following Formula (III).

wherein R$_2$ is H or CH$_3$; R$_3$ is an alkylene group having 2 to 3 carbon atoms; Z is Cl, Br, OCH$_3$, OEt, SCH$_3$ or SEt; and m2 and n2 are each an integer such that (m2+n2)=0 to 6.

Preferred examples of the compound represented by Formula (I) include 2,2-bis(4-allylcarbonatoethoxy-3,5-dichlorophenyl)propane, 2,2-bis(4-allylcarbonatoethoxy-3-bromophenyl)propane, and 2,2-bis(4-allylcarbonatoethoxy-3,5-dibromophenyl)propane. Preferred examples of the compound represented by Formula (II) include 2,2-bis(4-allyletherethoxy-3,5-dibromophenyl)propane, 2,2-bis(4-allyletherethoxy-3,5-dichlorophenyl)propane, and 2,2-bis(4-allyletherdiethoxy-3,5-dibromophenyl)propane. Preferred examples of the compound represented by Formula (III) include 2,2-bis(4-methacryloyloxyethoxy-3,5-dichlorophenyl)propane, and 2,2-bis(4-methacryloyloxyethoxy-3,5-dibromophenyl)propane.

Polyumerization initiators used in polymerizing the above monomers includes diacyl peroxides such as benzoyl peroxide and p-chlorobenzoyl peroxide, and percarbonates such as diisopropyl peroxydicarbonate and di-secondary-butyl peroxydicarbonate.

In instances of conventional amorphous polymers as exemplified by polymethyl methacrylate and polycarbonate, orientation, melt fracture or the like occurs along the flow of resin in molding the polymer, and the strain thus produced brings about unevenness in density to cause the non-uniformity and birefringence, leading to disturbance of laser beams in exposing them to light. Therefore an undesired pattern is formed other than the

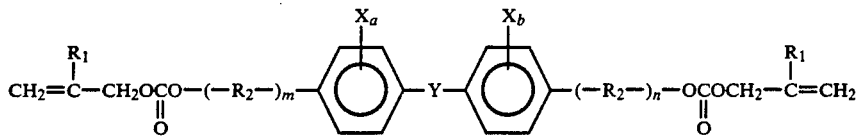

wherein R$_1$ is H or CH$_3$; R$_2$ is —CH$_2$CH$_2$O—,

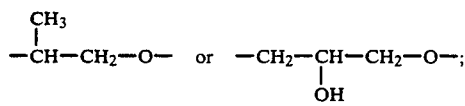

desired diffraction pattern, and no satisfactory diffraction efficiency can be obtained.

For polyvinyl carbazole type of sensitive materials, an organic solvent is always used in the step of coating a sensitive material layer and the step of developing, and hence in the above step the amorphous polymers used as a substrate are dissolved by the solvent used for the polyvinyl carbazole sensitive materials, because of an insufficient solvent resistance of the conventional amorphous polymers. It has been difficult to find a solvent which can be a solvent for polyvinyl carbazole and at the same time a non-solvent for the amorphous polymers to prepare holograms with a high performance. Accordingly, to form a polyvinyl carbazole hologram on the above amorphous polymer, it has been practical to peel a hologram prepared on a glass substrate and then transfer it onto the above-mentioned polymer substrate.

In the substrate of the present invention, a low-viscous monomer is used in carrying out molding and polymers are crosslinked with heat or light, so that, different from the conventional polymers, the substrate can be free from any strain produced in carrying out the molding, and thus a substrate with a high uniformity, free of any non-uniformity in refractive indices that is caused by unevenness in crosslinking, can be obtained by carrying out the molding under conditions achievable of sufficient crosslinking.

In carrying out exposure to light to form the polyvinyl carbazole hologram on the substrate having such a high uniformity, good exposure conditions are achieved to obtain a hologram with high reflective efficiency ascribable to the scattering of laser beams caused by the non-uniformity of substrates.

As a characteristic feature of commonly available crosslinked polymers, they have a good solvent resistance. In particular, the crosslinked polymer used in the present invention shows a sufficient resistance to all kinds of solvents used in forming the polyvinyl carbazole hologram, and hence it can be handled in entirely the same way as the glass.

The vinylcarbazole type of polymer that constitute the sensitive material layer used in the hologram according to the present invention refers to polyvinyl carbazole, an alkyl substitute of polyvinyl carbazole, a halogen-substituted derivative of polyvinyl carbazole, and a polymer mainly composed of any of these, one or more of which can be used optionally. Specifically, there can be utilized, for example, polyvinyl carbazole, 3-chlorovinylcarbazole polymer, 3-bromovinylcarbazole polymer, 3-iodovinylcarbazole polymer, 3-methylvinylcarbazole polymer, 3-ethylvinylcarbazole polymer, chlorinated polyvinyl carbazole, brominated polyvinyl carbazole, etc.

Of these, unsubstituted vinylcarbazole is preferred in actual use since it is readily available and yet particularly superior in the performances of the resulting holograms.

The vinylcarbazole polymer may also have been optionally copolymerized with other monomers for the purpose of controlling the properties such as strength and flexibility that are required when formed into a film. Other monomers usable in such purpose may include, for example, in addition to the above vinylcarbazoles, vinyl esters such as vinyl acetate, acrylic acid and methacrylic acid, ethylene with α-olefin such as styrene and styrene derivatives, and copolymerizable vinyl monomers. Other polymers as exemplified by polystyrene, a styrene/hydrogenated a styrene/butadiene copolymer can also be used by blending within the range where a hologram diffraction pattern can be recorded. These are used by selecting the proportion of addition so that the desired properties can be obtained.

The vinylcarbazole polymer is used in the holography in the state activated with radiation by use of an iodine compound.

As the iodine compound, those which are capable of coexisting in a polymer component to constitute a layer sufficiently sensitive to the visible light wavelength, as exemplified by carbon tetraiodide, iodoform, ethylene tetraiodide, triiodoethane, tetraiodoethane, pentaiodoethane, and hexaiodoethane.

The hologram of the present invention is prepared in the following manner: The above vinylcarbazole polymer and iodine compound are dissolved in a solvent capable of dissolving the both, as exemplified by chlorobenzene, xylene, pyridine and quinoline, and formed into a film with a desired thickness on the substrate constituted of the crosslinked polymer.

The sensitive material layer thus formed may have a thickness variable depending on the object and use of holograms, and be regulated within the range of from 5 to 20 μm.

Thereafter the steps of drying, exposure to light and developing are carried out. In the developing step, the film is swelled using a good solvent for the vinylcarbazole polymer, and shrinked using a poor solvent or a non-solvent for the same.

The crosslinked polymer that constitutes the substrate of the present invention is desired to exhibit no or negligible optical and mechanical change during the solvent treatment for film formation and developing. The crosslinked polymers exemplified above can satisfy these points. The exemplified crosslinked polymers can also hold the sensitive material layer in a good state without any particular subbing treatment.

The solvents used in the developing step are exemplified below.

The solvents include benzene or naphthalene derivatives such as benzene, toluene, xylene, ethylbenzene, n-propylbenzene, cumene, phenol, cresol, chlorobenzene, dichlorobenzene, nitrobenzene, benzyl alcohol, benzyl chloride, benzyl bromide, α-methylnaphthalene and α-chloronaphthalene. These solvents include even those having a solvency, or having no swelling effect at all around a room temperature to the polymer constituting the sensitive material layer, but can be made usable by changing the developing temperature. As the shinking liquid, any solvent can be used which does not swell nor dissolve the sensitive layer material and is compatible with the swelling solvent. There can be used, for example, alkanes and cycloalkanes such as n-pentane, n-hexane, n-heptane, n-octane, isooctane, and cyclohexane; alcohols such as methyl alcohol, ethyl alcohol, n-propyl alcohol, isopropyl alcohol, n-butyl alcohol, tert-butyl alcohol, n-amyl alcohol, and isoamyl alcohol; ethers such as diethyl ether, methyl ethyl ether, diisopropyl ether; ketones such as acetone, and methyl ethyl ketone; and esters such as ethyl acetate, methyl acetate, ethyl formate, and methyl propionate.

EXAMPLES

The present invention will be specifically described below by giving Examples.

EXAMPLE 1

In a polymerization mold formed of a glass plate of 150 mm×150 mm×2 mm, surrounded with polyethylene on its periphery, 2,2-bis(4-allylcarbonatoethoxy-3,5-dibromophenyl)propane and 3% by weight of benzoyl peroxide were mixed, and the reaction was carried out for 4 hours in an oven heated to 70° C., and thereafter at 100° C. for 4 hours.

After being cooled, the resulting polymer was released from the mold, and its spectral transmittance was measured to find that it showed a transmittance of 98% at 400 nm to 700 nm. The refractive index $n_d$ was 1.60, and the birefringence and uniformity in refractive index were $1\times10^{-4}$ and $5\times10^{-5}$, respectively. A falling ball test was carried out according to the FDA standard from a height of 127 cm using a ball of 16 mm in diameter and 16.6 g in weight to find that no crack or the like was observed at all.

In the dark, using the above polymer as a substrate, a solution obtained by dissolving 2.5 g of poly(N-vinylcarbazole) and 0.2 g of carbon tetraiodide in 30 g of monochlorobenzene was coated on the substrate and then dried, to obtain a sensitive material layer of 5.0 μm in film thickness, for use in the formation of a hologram.

Absorbance of the resulting sensitive material layer was measured with a spectrophotometer UVIDEC-650 (manufactured by Nippon Bunko Co., Ltd.) to find that it had an absorption edge up to 560 nm.

Two light beams from an argon laser (514.5 nm) was introduced onto this sensitive material layer, one beam being vertically incident and the other beam being incident from the reflection side with an incident angle of 20°. The interference fringe was observed thereon under conditions of a light intensity ratio of 1:1.

After exposure to light, the sensitive material layer was processed following the steps (1) to (3) shown below to obtain a hologram of the present invention successively:

(1) Immersed in acetone at 20° C. for 2 minutes.
(2) Immersed in xylene at 35° C. for 3 minutes.
(3) Immersed in n-heptane at 25° C. for 3 minutes, followed by drying.

The resulting hologram was found to be a volume type phase reflection hologram having a diffraction efficiency of 88% under the exposure of 40 mJ/cm² to the light of a wavelength of 514.5 nm, and a transmittance of 90% with respect to the zero-order transmitted light.

The spurious hologram was determined according to the description in "Volume Hologram and Volume Gratings" by L. Solymar and D. J. Cooke (Academic Press, 1981) Chapter 4, page 111.

The transmitted diffraction light intensity (undesired diffraction fringes) was found to be 11%.

EXAMPLE 2

Polymerization was carried out in the same manner as Example 1 except for using 2,2-bis(4-allyletherethoxy-3,5-dibromophenyl)propane in place of 2,2-bis(4-allylcarbonatoethoxy-3,5-dibromophenyl) propane used in Example 1.

The resulting polymer had a spectral transmittance of 95% and a refractive index of 1.61. The birefringence and uniformity of refractive index were $3.0\times10^{-4}$ and $2\times10^{-4}$, respectively.

Using such a substrate, a hologram was formed in the same manner as Example 1, thus obtaining a reflection hologram having a diffraction efficiency of 87% and a transmittance to zero-order transmitted light of 88%.

The spurious diffraction hologram produced in the hologram were found to be 9%.

EXAMPLE 3

Using 4,4'-diacryloylpropioxy-2-methoxybiphenyl in place of 2,2-bis(4-allylcarbonatoethoxy-3,5-dibromophenyl)propane used in Example 1, a polymer was obtained by carrying out the reaction at 80° C. for 4 hours and thereafter at 100° C. for 6 hours.

The resulting polymer had a spectral transmittance of 96% and a refractive index of 1.60. The birefringence and uniformity of refractive index were $8\times10^{-4}$ and $1\times10^{-4}$, respectively.

Using such a substrate, a hologram was formed in the same manner as Example 1, thus obtaining a reflection hologram exhibiting a diffraction efficiency of 88% and a transmittance to zero-order transmitted light of 88%.

The spurious diffraction hologram produced in the hologram were found to comprise 11%.

COMPARATIVE EXAMPLE 1

Diethylene glycol bisallyl carbonate (trade name: CR-39) was used as a substrate. This substrate had a spectral transmittance of 98% and a refractive index of 1.49. The birefringence and uniformity of refractive index were $4\times10^{-5}$ and $3\times10^{-4}$, respectively.

Using this substrate, it was tried to form a hologram in the same manner as Example 1, but the sensitive material layer was peeled off in the developing step.

Then, a silane hard coat of 1 μm thick was previously provided on the substrate surface, and the sensitive material layer was formed thereon to prepare a hologram. As a result, it had a diffraction efficiency of 85% and a transmittance to zero-order transmitted light, of 89%.

The undesired transmission diffraction fringes produced in the hologram were found to be 36%.

We claim:

1. A hologram recordable material comprising (i) a substrate comprising a crosslinked polymer having a transmittance of at least 90% in a wavelength region of from 400 to 700 nm and a refractive index of at least 1.55 and (ii) a photosensitive material layer positioned on said substrate, said photosensitive material layer comprising a substituted or unsubstituted vinyl carbazole polymer and an iodine compound.

2. The photosensitive material according to claim 1, wherein said substrate has a refractive index of 1.60 or more.

3. The photosensitive material according to claim 1, wherein said sensitive material layer has a film thickness in the range of from 5 to 20 μm.

4. The photosensitive material according to claim 1, wherein said crosslinked polymer is a crosslinked polymer comprising a polyfunctional monomer having an aromatic ring.

5. The photosensitive material according to claim 1, wherein said crosslinked polymer is a polymer obtained from a monomer selected from the group consisting of Formula (I), (II) or (III):

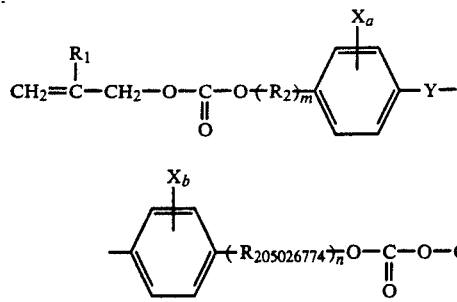

Formula I

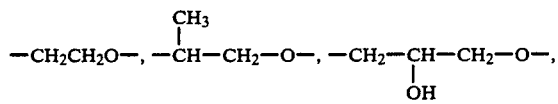

wherein $R_1$ is H or $CH_3$; $R_2$ is

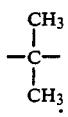

$-CH_2CH_2O-$, $-\underset{\underset{CH_3}{|}}{CH}-CH_2-O-$, $-CH_2-\underset{\underset{OH}{|}}{CH}-CH_2-O-$, X is Cl or Br; Y is —, —O—, —CO—, —SO$_2$—, —CH$_2$—, —CH=CH—, or $$-\underset{\underset{CH_3}{|}}{\overset{\overset{CH_3}{|}}{C}}-$$

m and n are each an integer of 1 to 4; and a and b are each independently an integer of 0 to 4;

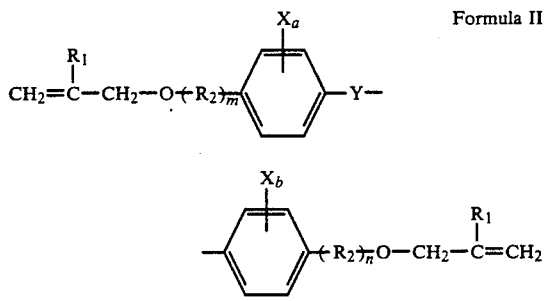

Formula II wherein $R_1$, $R_2$, X, Y, m, n, a, and b are as defined above;

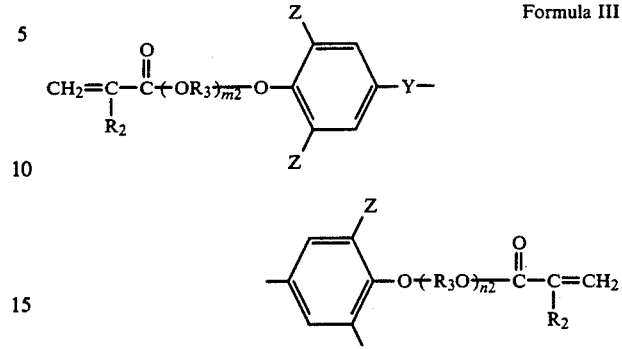

Formula III wherein $R_2$ is H or $CH_3$; $R_3$ is an alkylene group having 2 to 3 carbon atoms; Z is Cl, Br, OCH$_3$, OEt, SCH$_3$ or SEt; and m2 and n2 are such that the sum of m2 and n2 is an integer from 0 to 6.

6. The photosensitive material according to claim 1, wherein the substituted or unsubstituted vinyl carbazole polymer is selected from the group consisting of polyvinyl carbazole, an alkyl substituted polyvinyl carbazole, a halogenated polyvinyl carbazole or copolymers thereof, said substituted or unsubstituted vinyl carbazole polymer having been further optionally copolymerized with a monomer selected from the group consisting of an ethylenic α-olefin or a vinyl monomer.

7. The photosensitive material according to claim 6, wherein said substituted or unsubstituted vinylcarbazole polymer is selected from the group consisting of polyvinyl carbazole, 3-chlorovinyl carbazole polymer, 3-bromovinyl carbazole polymer, 3-iodovinyl carbazole polymer, 3-methyl vinylcarbazole polymer, 3-ethylvinyl carbazole polymer, chlorinated polyvinyl carbazole and brominated polyvinyl carbazole.

8. The photosensitive material according to claim 1, wherein said iodine compound is selected from the group consisting of carbon tetraiodide, iodoform, ethylene tetraiodide, triiodoethane, tetraiodoethane, pentaiodoethane and hexaiodoethane.

* * * * *

UNITED STATES PATENT AND TRADEMARK OFFICE
CERTIFICATE OF CORRECTION

PATENT NO. : 5,026,618
DATED : June 25, 1991
INVENTOR(S) : NOBUO KUSHIBIKI, ET AL.

It is certified that error appears in the above-identified patent and that said Letters Patent is hereby corrected as shown below:

On the title page:

IN [30] FOREIGN APPLICATION PRIORITY DATA

Insert: --Feb. 9, 1989 [JP] Japan ...... 1-28573--.

COLUMN 4

Line 47, "Polyumerization" should read --Polymerization--.
Line 48, "includes" should read --include--.

COLUMN 5

Line 42, "constitute" should read --constitutes--.

COLUMN 7

Line 15, "1 X 10 - 4 and 5 X 10 - 5," should read
--1 X $10^{-4}$ and 5 X $10^{-5}$,--.
Line 65, "3.0 X 10 - 4" should read --3.0 X $10^{-4}$--.
Line 66, "2 X 10 - 4," should read --2 X $10^{-4}$,--.

COLUMN 8

Line 4, "were" should read --was--.
Line 22, "were" should read --was--.

UNITED STATES PATENT AND TRADEMARK OFFICE
CERTIFICATE OF CORRECTION

PATENT NO. : 5,026,618
DATED : June 25, 1991
INVENTOR(S) : NOBUO KUSHIBIKI, ET AL.

Page 2 of 2

It is certified that error appears in the above-identified patent and that said Letters Patent is hereby corrected as shown below:

COLUMN 9

Line 11, "$R_{205026774}$" should read --$R_2$--.

Signed and Sealed this

Ninth Day of March, 1993

Attest:

STEPHEN G. KUNIN

Attesting Officer

Acting Commissioner of Patents and Trademarks